(12) United States Patent
Han et al.

(10) Patent No.: US 6,643,140 B2
(45) Date of Patent: Nov. 4, 2003

(54) PRINTED CIRCUIT BOARD RETAINING DEVICE FOR MONITORS

(75) Inventors: Jeong-Seon Han, Kyungki-do (KR); Seon-Kyu Park, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/060,166

(22) Filed: Feb. 1, 2002

(65) Prior Publication Data

US 2002/0085341 A1 Jul. 4, 2002

Related U.S. Application Data

(62) Division of application No. 09/084,933, filed on May 28, 1998, now Pat. No. 6,370,031.

(30) Foreign Application Priority Data

| May 28, 1997 | (KR) | ............................................. | 97/12280 |
| May 28, 1997 | (KR) | ............................................. | 97/12283 |
| May 28, 1997 | (KR) | ............................................. | 97/12284 |
| Nov. 26, 1997 | (KR) | ............................................. | 97/33935 |

(51) Int. Cl.[7] ................................................ H05K 7/00
(52) U.S. Cl. ........................ 361/752; 361/753; 361/759; 361/801; 361/825
(58) Field of Search .............................. 361/759, 752, 361/682, 683, 681, 753, 801, 807, 825; 312/7.2, 223.2; 348/836

(56) References Cited

U.S. PATENT DOCUMENTS

| 4,644,408 | A | * | 2/1987 | Coleman | ..................... 348/836 |
| 4,750,091 | A | | 6/1988 | Van Hout | .................... 361/759 |
| 4,780,570 | A | * | 10/1988 | Chuck | ................... 174/35 GC |
| 4,903,167 | A | | 2/1990 | Lichtensperger | ............ 361/759 |
| 5,363,150 | A | * | 11/1994 | Kojima | ........................ 348/836 |
| 5,523,527 | A | | 6/1996 | Mann et al. | ........... 174/35 GC |
| 5,596,170 | A | * | 1/1997 | Barina et al. | .............. 174/35 R |
| 5,740,019 | A | | 4/1998 | Lee | .............................. 361/759 |
| 5,863,106 | A | | 1/1999 | Beak | .......................... 312/7.2 |
| 5,980,003 | A | * | 11/1999 | Huang | ..................... 312/223.2 |
| 6,078,504 | A | * | 6/2000 | Miles | ......................... 361/727 |
| 6,231,364 | B1 | * | 5/2001 | Liu | .............................. 439/326 |
| 6,297,954 | B1 | * | 10/2001 | Seo | .............................. 361/686 |
| 6,421,911 | B1 | * | 7/2002 | Misner et al. | ................ 29/842 |

* cited by examiner

*Primary Examiner*—Jayprakash N. Gandhi
(74) *Attorney, Agent, or Firm*—Robert E. Bushnell, Esq.

(57) ABSTRACT

A printed circuit board retaining device for restricting the movement of a printed circuit board to which tactile switches are mounted. The printed circuit board retaining device having components that prevent lateral movement of the printed circuit board with respect to a bracket in which the printed circuit board is mounted. These components provide a force that counters forces created by the activation of switches directly mounted to the main printed circuit board.

10 Claims, 8 Drawing Sheets

PRINTED CIRCUIT BOARD RETAINING DEVICE FOR MONITORS

CROSS-REFERENCE TO RELATED APPLICATIONS

This application is a divisional of applicant's Ser. No. 09/084,933 filed in the U.S. Patent & Trademark Office on May 28, 1998, now U.S. Pat. No. 6,370,031, and assigned to the assignee of the present invention.

CLAIM OF PRIORITY

This application makes reference to, incorporates the same herein, and claims all rights accruing thereto under 35 U.S.C. §119 through my patent applications entitled PCB Movement Restriction Device And Monitor Comprising The Same earlier filed in the Korean Industrial Property Office on the day of May 28, 1997 and there duly assigned Ser. Nos. 1997/12284, 1997/12280, 1997/12283, and my patent application entitled PCB Movement Restriction Device And Monitor Comprising The Same earlier filed in the Korean Industrial Property Office on the Nov. 26, 1997 and there duly assigned Ser. No. 33435/1997.

BACKGROUND OF THE INVENTION

1. Field of the Invention

The present invention relates to monitor components and, more specifically, to a securing device for a printed circuit board that restricts the movement of the printed circuit board and thus simplifies the use of tactile switches that are attached to the printed circuit board.

2. Background Art

Generally, monitors can support tactile switches using one of two methods. One method of attaching tactile switches to a monitor is to mount the switches on a separate printed circuit board from the main printed circuit board. A second method used to support tactile switches in monitors is to attach the switches directly to the main printed circuit board. The monitor that has the various switches installed on the main printed circuit board has the advantage of having fewer parts that need to be assembled during the monitor assembly process. However, one disadvantage of mounting the tactile switches directly to the main printed circuit board is that the mounting of the printed circuit board requires more accuracy and a more secure mounting method to ensure the proper operation of the switches.

A monitor with tactile switches installed on the main printed circuit board may be constructed using a front cover that is fixed to a first bracket that supports a cathode ray tube. The rear cover is attached to the rear side of the front cover. The main printed circuit board has a multitude of electric devices and tactile switches that input commands to the main printed circuit board that processes video signals. A second bracket is fixed to the first bracket and supports the main printed circuit board. A stand allows the monitor to rotate through a predetermined range of motion with respect to a user. A bottom member is affixed to the underside of the second bracket and is engaged with the top of the stand. The main printed circuit board is secured to the second bracket by a plurality of fasteners.

There are many difficulties with the monitors of the contemporary art that utilize printed circuit boards that have attached switches. For example, when the tactile switches are pressed, the main printed circuit board, on which the tactile switches are mounted, moves slightly within the second bracket due to manufacturing and tolerance errors. This results in the printed circuit board being progressively misaligned. Additionally, since the main printed circuit board makes contact with the inner surfaces of the second bracket, an increased amount of time is required to secure the main printed circuit board onto the second bracket when the second bracket is deformed. This increases the precision of tolerances required to manufacture a bracket that supports a printed circuit board that has mounted switches. Furthermore, if the tactile switch is mounted to the printed circuit board in a position closer to the rear of the monitor than specified in the design, then the tactile switches will not be pressed directly even when a function switch, positioned on the front cover, is pressed. If the tactile switches are installed on the printed circuit board too close to the front of the monitor, then the tactile switches and the function switches will always be in contact. Thus, even when the main printed circuit board is accurately installed, the placement of the tactile switches on the printed circuit board is critical. Thus, a monitor that has function switches mounted on the main printed circuit board can have difficulty functioning properly and avoiding malfunctions.

As such, I believe that it may be possible to improve on the contemporary art by providing a bracket for monitors that has improved securing characteristics for a printed circuit board, that allows switches to be mounted directly to the main printed circuit board without undergoing progressive misalignment, that simplifies the assembly process by allowing the switches to be attached to the printed circuit board during the manufacturing process of the printed circuit board, that has enough elastic resilience to prevent the tactile switches from fracturing when an excessive amount of force is provided, and that actually guide the printed circuit board into the proper position on the bracket during the monitor assembly process.

SUMMARY OF THE INVENTION

Accordingly, it is an object of the present invention to provide an improved main printed circuit board retaining device for monitors.

It is another object to provide a main printed circuit board retaining device for monitors that allows switches to be mounted directly to the printed circuit board without the board undergoing progressively increasing misalignment as the buttons are used.

It is still another object to provide a main printed circuit board retaining device for monitors that has improved printed circuit board securing characteristics.

It is yet another object to provide a main printed circuit board retaining device for monitors that simplifies the monitor assembly process by allowing the switches to be mounted ahead of time on the main printed circuit board prior to the assembly of the monitor and thus avoiding the difficulties in precise switch positioning.

It is still yet another object to provide a main printed circuit board retaining device for monitors that has enough elastic resilience to prevent the switches that are directly mounted on the printed circuit board from fracturing when an excessive amount of force is provided while securing the printed circuit board in the correct position relative to the supporting bracket.

It is a further object to provide a main printed circuit board retaining device for monitors that guides the printed circuit board into position on the bracket during the assembly process, thus further simplifying the manufacturing process as printed circuit boards bearing switches need to be more precisely placed within the monitor housing than printed circuit boards that do not have tactile switched directly mounted.

These and other objects can be achieved, by providing a printed circuit board retaining device that may be constructed using a bracket with side walls to hold the printed circuit board in place. The bracket can either use abutments in the side walls or a locker device to secure the printed circuit board to the bracket. The tactile switches that are mounted to the printed circuit board are maintained in a stable position relative to the chassis due to the side walls of the bracket.

One type of abutment that can be used to retain the printed circuit board in the bracket is to have a multitude of protrusions projecting inwards from the side walls. Preferably, the protrusions are formed as an integral unit with the side walls. The protrusions exert a force onto the printed circuit board that prevents the printed circuit board from separating from the bracket. The protrusion can be easily manufactured using a tool to exert a force on the bracket that deforms the side walls of the bracket. However, the protrusion must not project inward from the side wall so far as to interfere with the mounting of the printed circuit board.

Alternatively, the board restraining device can be a flap formed by cutting out a part of the side wall and bending it inwards. In this case, it is preferable to provide a groove at a side of the printed circuit board or configure the side profile of the printed circuit board so that the movement of the printed circuit board is restricted by the flap. The bracket may be designed to have an inclined surface that can guide the printed circuit board into position during the assembling process.

The side walls can be manufactured so that the flap is merely a cut out section of the side wall that is bent inwards, thus the side wall provides support for the flap.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DESCRIPTION OF THE PREFERRED EMBODIMENT

Figure 1:
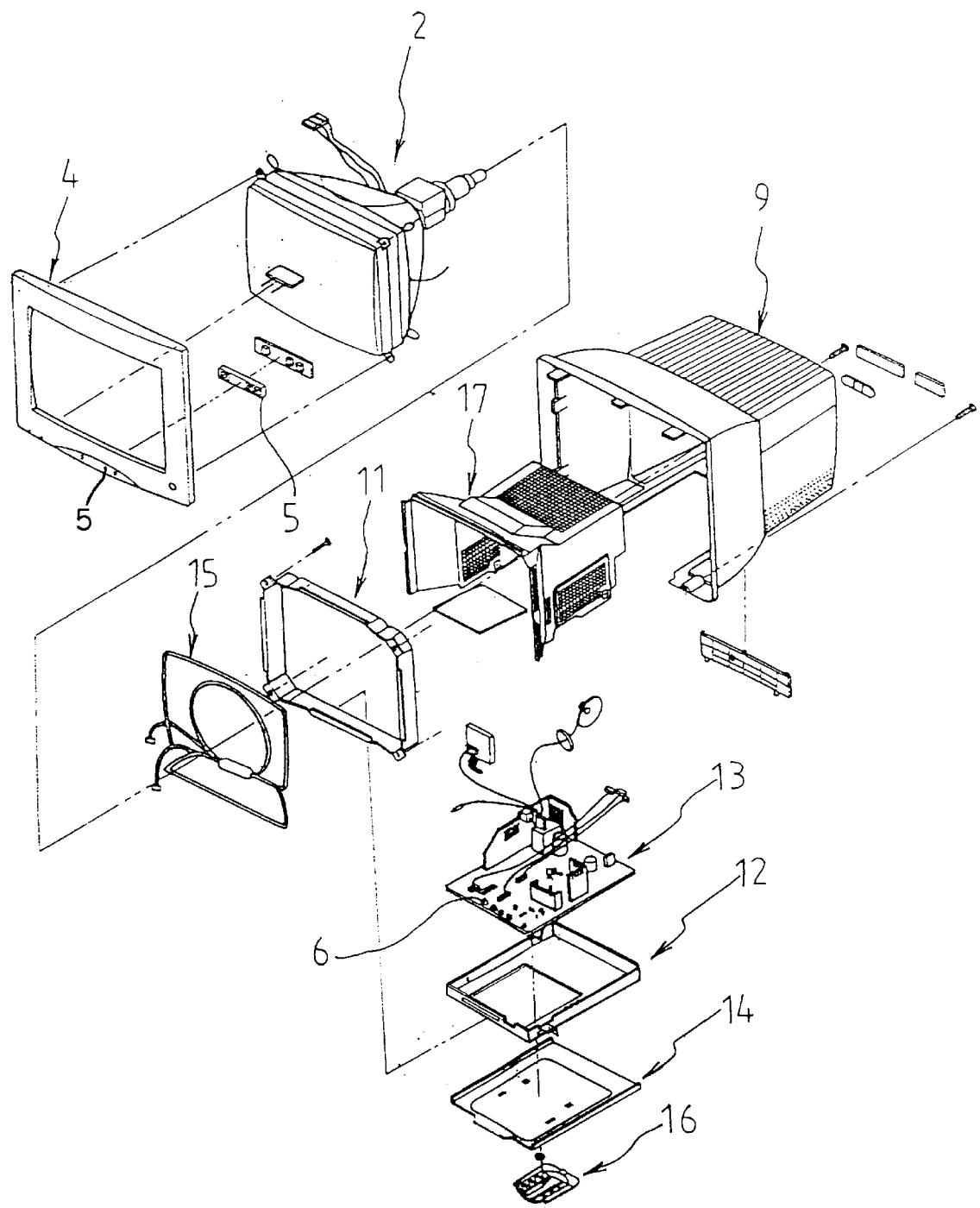
FIG. 1 is an exploded perspective view of a monitor having tactile switches mounted on the printed circuit board.
Figure 2:
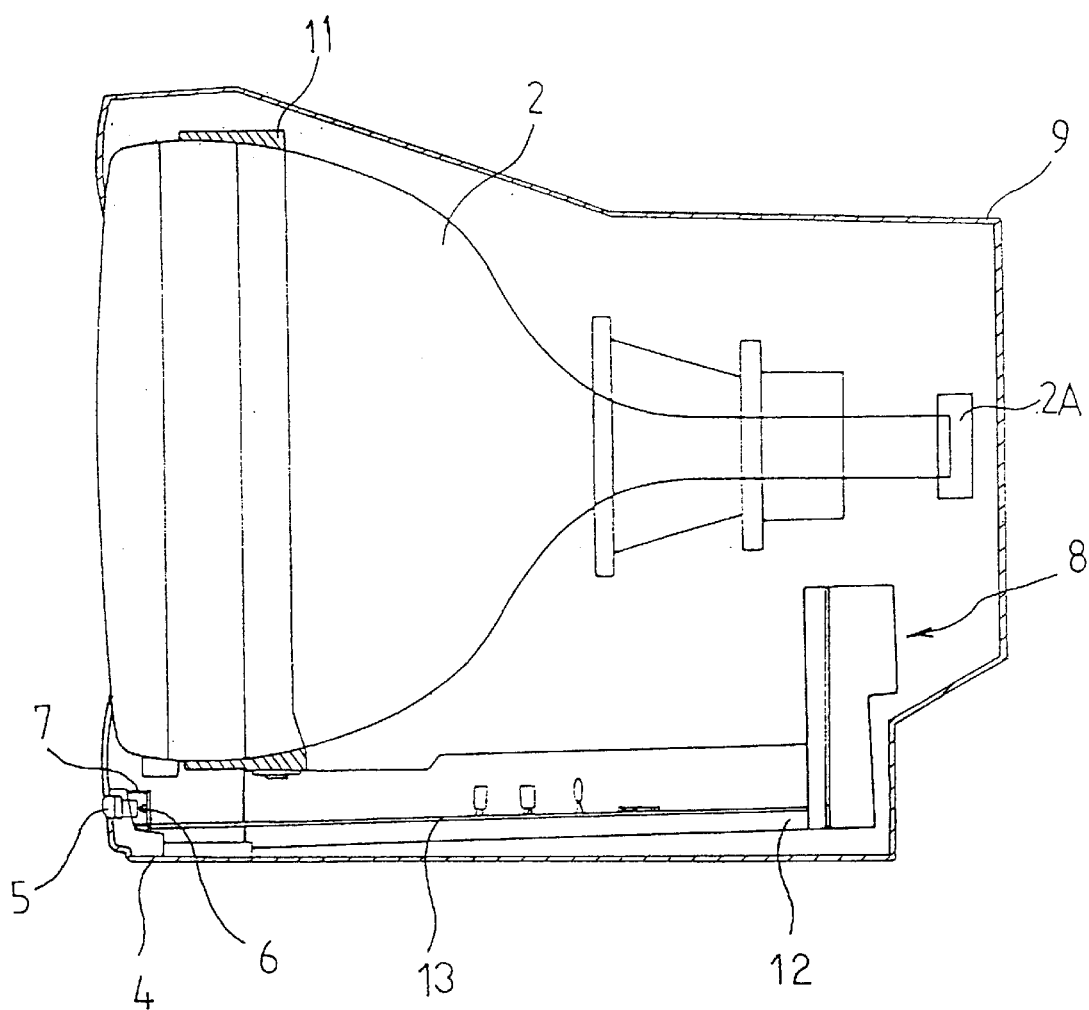
FIG. 2 is a schematic cross-sectional view of the monitor of FIG. 1.

Turning now to the drawings, FIGS. 1 and 2 illustrate a monitor that has tactile switches installed on the main printed circuit board. The monitor may be constructed using front cover 4 that is fixed to first bracket 11 that supports cathode ray tube 2. Rear cover 9 is attached to the rear side of the front cover. The covers combine to form a chassis that encloses degaussing coil 15 that eliminates magnetic fields that are generated by cathode ray tube 2. Main printed circuit board 13 has a multitude of electric devices and tactile switches 6 that are used to input commands to the printed circuit board. Buttons 5 protrude through front cover 4 and are aligned with tactile switches 6. Second bracket 12 is fixed along one edge to first bracket 11 and supports the main printed circuit board. Stand 16 allows the monitor to rotate through a predetermined range of motion with respect to a user. Bottom member 14 is affixed underneath second bracket 12.

Figure 3:
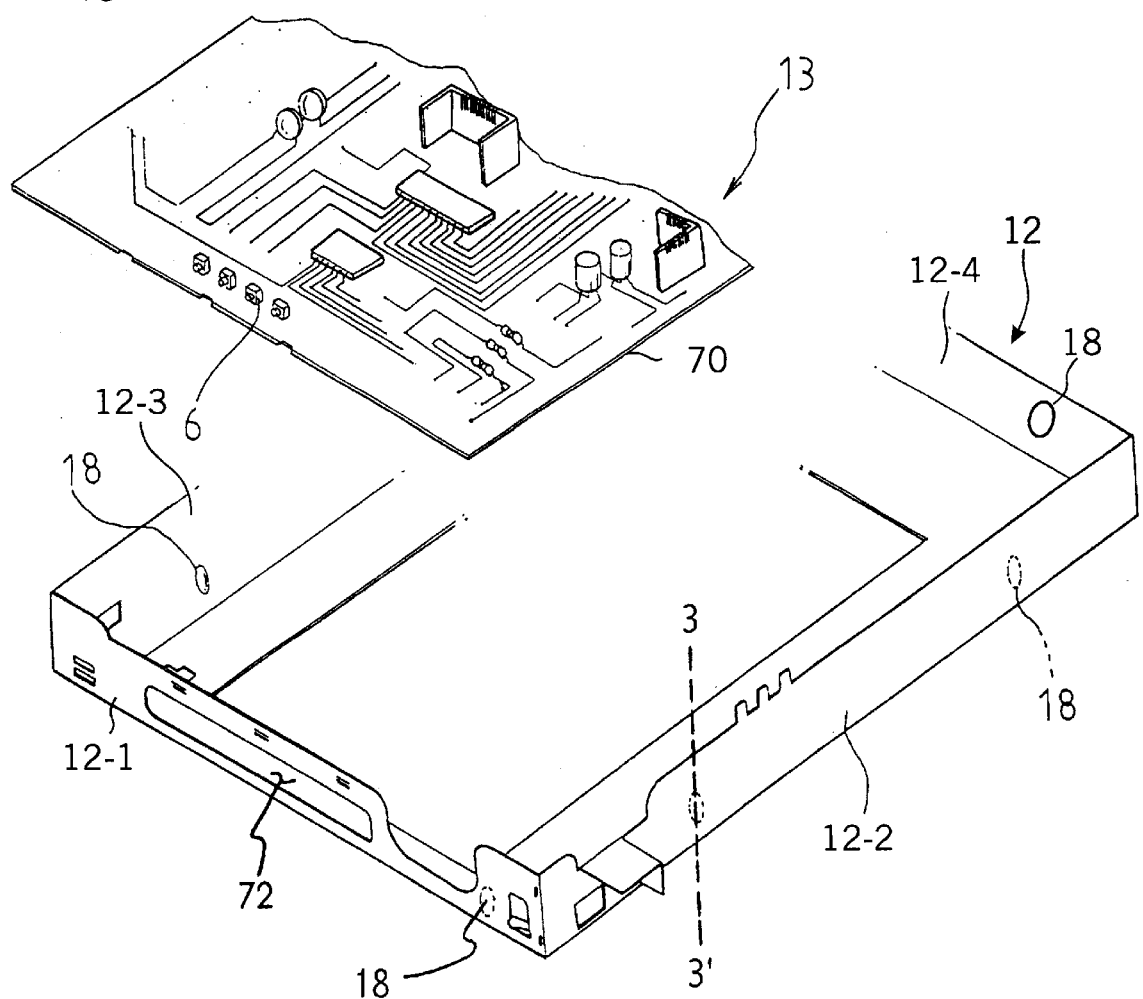
FIG. 3 is a perspective view of a printed circuit board retaining device as constructed according to the principles of the present invention.
Figure 4:
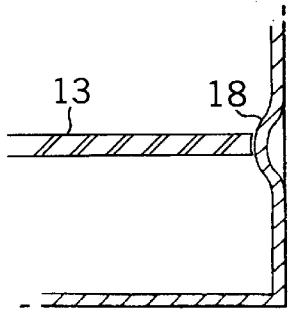
FIG. 4 is a cross-sectional view of the printed circuit board retaining device of FIG. 3 as taken along the line 3–3'.

A printed circuit board retaining device as constructed according to the first embodiment of the present invention is shown in FIG. 3. Printed circuit board 13 is installed within bracket 12. When printed circuit board 13 is mounted the side surfaces 70 abut protrusion 18. Switches 6 are aligned with perforation 72 in front wall 12-1 of bracket 12 to allow the switches to be depressed when buttons 5 (FIGS. 1 and 2), that are located on the front cover 4 (FIGS. 1 and 2), are depressed. Tactile switches 6 are installed on the front of printed circuit board 13. Bracket 12 has protrusions 18 that restrict the movement of the main printed circuit board 13. FIG. 4 is a cross-sectional view of the printed circuit board retaining device, i.e., protrusions 18, of FIG. 3 as taken along the line 3–3'.

Referring again to FIGS. 3 and 4, protrusions 18 are provided on the front wall 12-1 and rear wall 12-4 of bracket 12, and at least two pairs of protrusions 18 are provided on both the right wall 12-2 and left wall 12-3 of the bracket 12. Thus, when printed circuit board 13 is installed on bracket 12, protrusions 18 exert a force on sides 70 of printed circuit board 13 that retains the printed circuit board 13, hence restricting lateral movements of printed circuit board 13.

Figure 5:
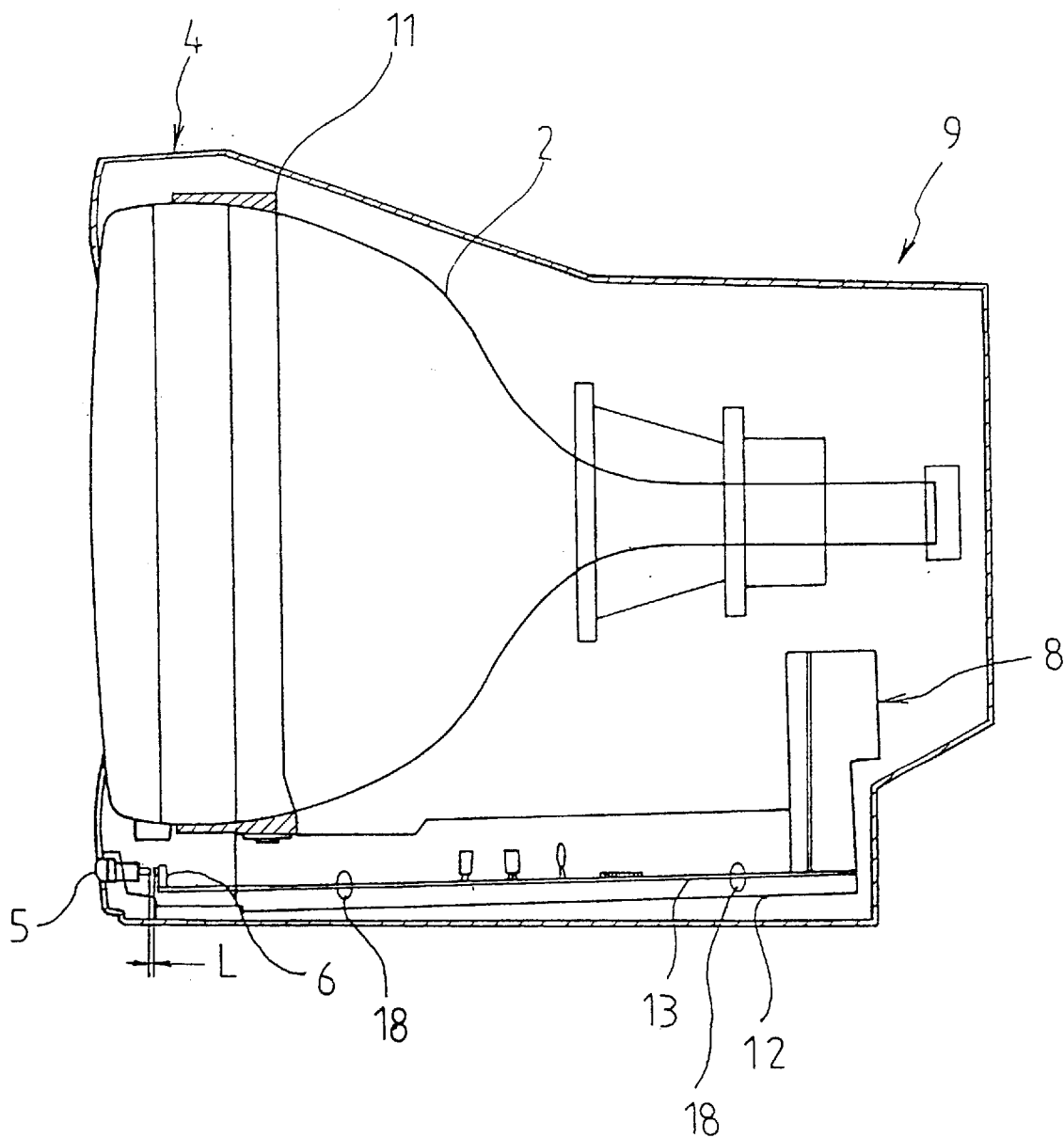
FIG. 5 is a cross-sectional view of a monitor with the printed circuit board retaining device of FIG. 3.

A cross-section of a monitor having the first embodiment of the printed circuit board retaining device is shown in FIG. 5. Protrusions 18 abut the sides 70 of the printed circuit board 13 to restrict the printed circuit board 13 from moving laterally. After printed circuit board 13 is mounted on bracket 12, a plurality of fasteners (not shown) are used to secure printed circuit board 13 against bracket 12. The fastener can be any one of solder, a bolt, a rivet, a screw, or an adhesive.

Figure 6:
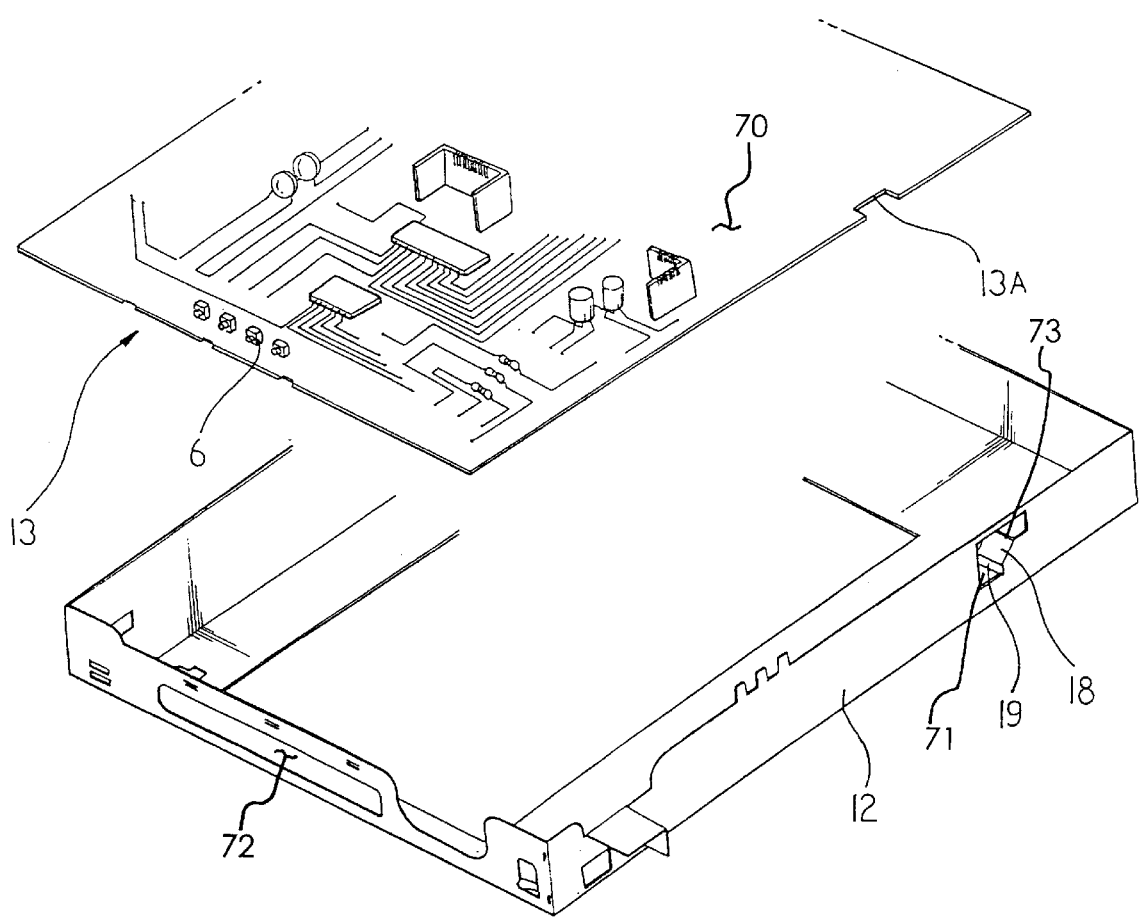
FIG. 6 is a perspective view of a printed circuit board retaining device as constructed according to a second embodiment of the present invention.

FIG. 6 shows a printed circuit board retaining device as constructed according to a second embodiment of the present invention. Flap 19 and inclined surface 18, located above the flap, are formed by cutting a portion of the side wall and then bending the cut portion inward. Groove 13A in the printed circuit board is fitted over flap 19 and inclined surface 18. Voids 71 and 73 are created when flap 19 and inclined surface 18 are formed by cutting a portion of bracket 12. When installing printed circuit board 13, the inclined surface 18 contacts an edge of groove 13A and guides printed circuit board 13 into position. Then, groove 13A is placed over the flap 19 and printed circuit board 13 is installed in the appropriate position within bracket 12. Switches 6 are aligned with perforation 72 in bracket 12 to allow the switches to be depressed when buttons 5 (FIGS. 1, 2 and 5), that are located on the front cover 4 (FIGS. 1, 2 and 5), are depressed. If excessive force is exerted on the printed circuit board via tactile switches 6 and buttons 5, flap 19 moves backwards due to the elastic nature of the flap. This prevents the fracturing of tactile switch 6. Thus, printed circuit board 13 will return to its normal location once the excess force is removed.

Figure 7:
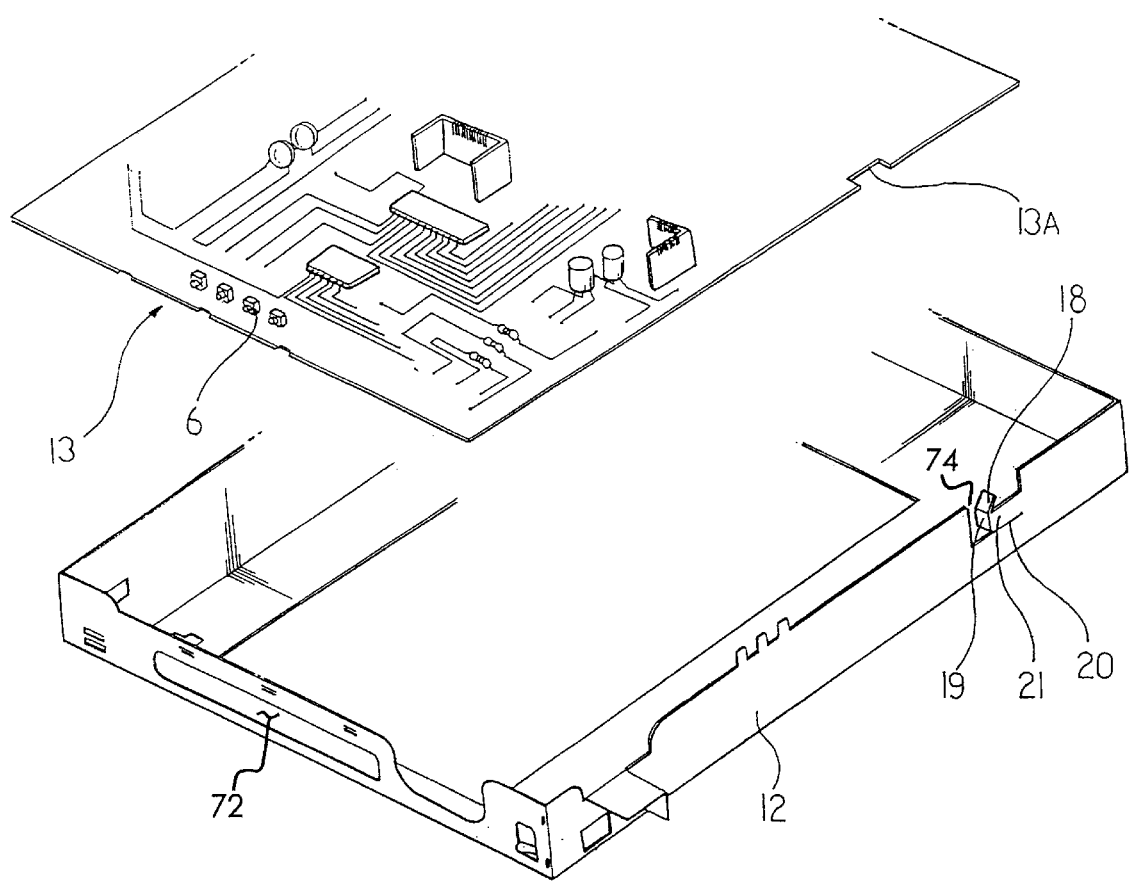
FIG. 7 is a perspective view of a printed circuit board retaining device as constructed according to a third embodiment of the present invention.

FIG. 7 shows a third embodiment of the printed circuit board retaining device as constructed according to the principles of the present invention. Switches 6 are aligned with perforation 72 in bracket 12 to allow the switches to be depressed when buttons 5 (FIGS. 1, 2 and 5), that are located on the front cover 4 (FIGS. 1, 2 and 5), are depressed. Many of the features are same as those described relating to the second embodiment above. Perforation 74 is formed when flap 19 and inclined surface 18 are cut out of bracket 12. One difference, however, is that a cut-line 20 starting from the portion connecting flap 19 and bracket 12 is formed. Due to the cut-line 20, the flap can be bent more flexibly than the flap of the second embodiment. This allows the flap to respond to smaller forces exerted on the printed circuit board via the tactile switches.

Figure 8:
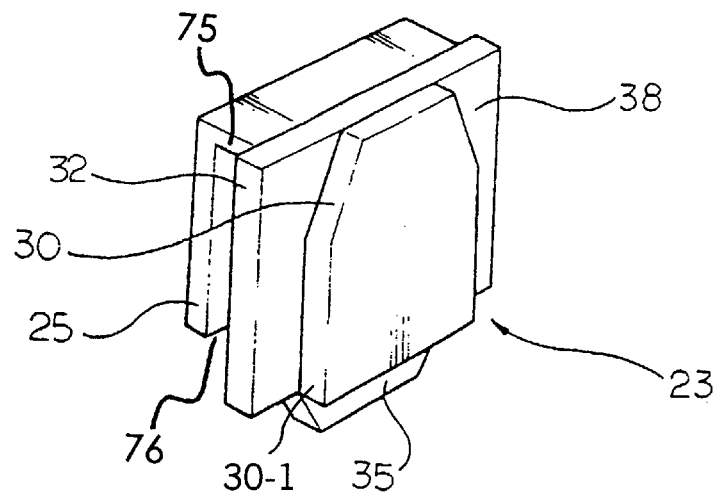
FIG. 8 is a perspective view of a locker device that, along with the corresponding bracket, comprises a fourth embodiment of the present invention.

FIG. 8 shows a locker device for use in cooperation with a bracket 12 to form the fourth embodiment of a printed circuit board retaining device. The locker device has body 38, lateral sides 32 and rectangular support slants 30. A gap 76 is formed between body 38 and clip 25 by a horizontal member 75 connecting clip 25 to body 38. An edge of bracket 12 is inserted inside gap 76 to secure the locker device to bracket 12. Resilient clip 25 and horizontal member 75 are integrally formed with body 38, wherein clip 25 is disposed apart from and along a back portion of body 38. Support slants 30 are symmetrically positioned and are slanted downwards so that groove 64, in the printed circuit board 13 shown in FIG. 10, can easily fit over support slants 30. Support walls 30-1 extend vertically downward from support slants 30 and contact the edges of groove 64 in printed circuit board 13 shown in FIG. 10. Thus, securing the printed circuit board 13 after the board is placed in position over the locker device 23.

Figure 9:
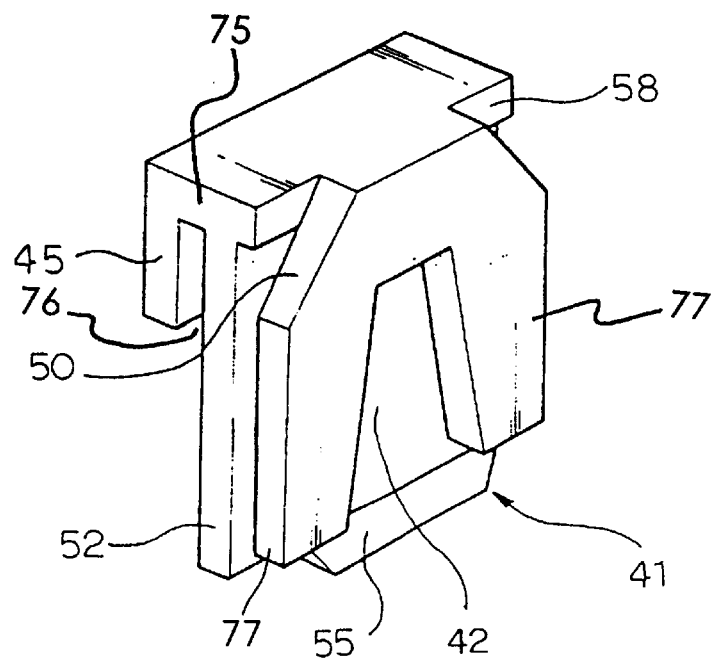
FIG. 9 is a perspective view of a locker device that, along with the corresponding bracket, comprises a fourth embodiment of the present invention.

A fifth embodiment of a printed circuit board retaining device is shown in FIG. 9. This locker device 41 has a cavity 42 positioned below support slants 50 and above locker tab 55. Gap 76 is formed by horizontal member 75 and clip 45. An edge of bracket 12 is inserted inside gap 76 to secure the locker device 41 to bracket 12. This locker device differs from the locker device of FIG. 8 in that support slants 50 are made of a resilient material. The resilience of support walls 77 is increased due to the cavity 42 positioned underneath the support slants 50. Accordingly, spacing between support walls 77 can be slightly larger that the gap formed in groove 64 of printed circuit board 13 shown in FIG. 10.

Figure 10:
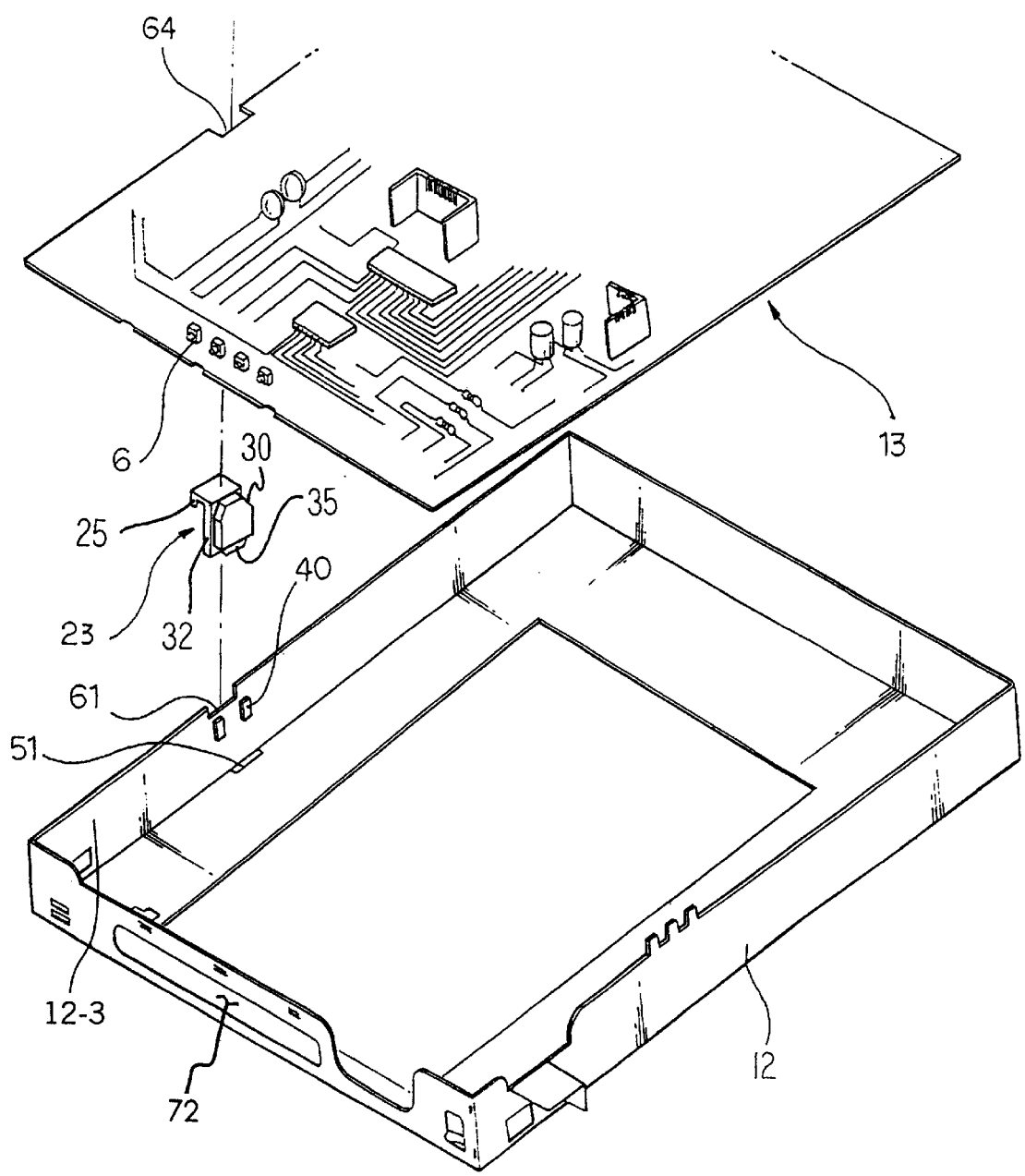
FIG. 10 is an exploded perspective view illustrating the use of a locker device to secure a main printed circuit board to a bracket.

FIG. 10 illustrates the securing of a printed circuit board 13 with a retaining device that uses locker device 23. When the printed circuit board 13 is in position, switches 6 are aligned with perforation 72 in bracket 12 to allow the switches 6 to be depressed when buttons 5 (FIGS. 1, 2 and 5), that are located on the front cover 4 (FIGS. 1, 2 and 5), are depressed. The lateral sides 32 of body 38 of locker device 23 are guided by guide pins 40 that protrude from the side wall 12-3 of bracket 12. Locker device 23 may be manufactured using a plastic or rubber molding process. An insert hole 51 is provided in the bottom of bracket 12 and is aligned with a notch 61 formed in side wall 12-3, thus enabling the bracket 12 to engage with the locker device 23. Side wall 12-3 fits into gap 76 and horizontal member 75 engages cut out portion 61 to prevent locker device 23 from moving in a lateral direction. Locker tab 35 is received in insert hole 51 to assist in the securing of the printed circuit board 13.

To secure printed circuit board 13 to bracket 12 using one of the two disclosed retaining devices that use a locker device, locker device 23 (41) should be aligned at a predetermined location along bracket 12. Then, the locker device 23 (41) is moved downwards and inserted into hole 51 in the bracket. The sides of locker device 23 (41) are guided into precise position by guide pins 40 of bracket 12. When printed circuit board 13 is aligned at a predetermined location above bracket 12, the printed circuit board can be inserted within bracket 12 and supporting slants 30 (50) pass through groove 64 of printed circuit board 13. It should be apparent that printed circuit board could comprise a second groove 64 on an opposite side thereof, thus bracket 12 would include a second notch 61 and guide pins 40 and a second locking device would be utilized.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A printed circuit board retaining device, comprising:
   a printed circuit board;
   a bracket supporting said printed circuit board and having a plurality of side walls;
   a plurality of retaining devices positioned along said side walls, each of said retaining devices comprising a protrusion having a domed shape forming a convex surface extending toward said printed circuit board; and
   said retaining devices preventing lateral movement of said printed circuit board within said bracket.

2. The device of claim 1, further comprising a plurality of switches mounted on said printed circuit board.

3. The device of claim 2, further comprising an elongated perforation in a front side wall of said bracket through which said plurality of switches can be activated by pressing corresponding buttons mounted on a front cover of a monitor.

4. A retaining device for preventing lateral movement of a printed circuit board, said retaining device comprising:
   said printed circuit board;
   a bracket having a plurality of side walls; and
   a plurality of protrusions positioned along said side walls, each of said protrusions having a convex surface extending toward and contacting edges of the periphery of said printed circuit board.

5. The retaining device of claim 4, further comprising an elongated perforation in a front side wall of said bracket through which a plurality of switches mounted on said printed circuit board protrude to enable said switches to be activated by a user pressing corresponding buttons mounted on a front cover of a monitor.

6. The retaining device of claim 5, wherein said front sidewall comprises at least one of said protrusions.

7. The retaining device of claim 4, wherein each of said sidewalls comprises at least one of said protrusions.

8. The retaining device of claim 4, wherein a rear sidewall and two sidewall of said plurality of sidewalls comprises at least one of said protrusions.

9. The retaining device of claim 4, wherein a rear sidewall and two sidewall of said plurality of sidewalls comprises at least two of said protrusions.

10. The retaining device of claim 9, wherein said front sidewall comprises at least one of said protrusions.

* * * * *